United States Patent
Fujino

[19]

[11] Patent Number: 5,960,253
[45] Date of Patent: Sep. 28, 1999

[54] METHOD OF MANUFACTURING SEMICONDUCTOR MEMORY DEVICE CAPABLE OF READILY REPAIRING DEFECTIVE PORTION RESULTING FROM MASK DEFECT

[75] Inventor: Takeshi Fujino, Hyogo, Japan

[73] Assignee: Mitsubishi Denki Kabushiki Kaisha, Tokyo, Japan

[21] Appl. No.: 08/899,814

[22] Filed: Jul. 24, 1997

[30] Foreign Application Priority Data

Feb. 18, 1997 [JP] Japan ..................................... 9-033753

[51] Int. Cl.⁶ ..................................................... H01L 21/00
[52] U.S. Cl. .................................. 438/4; 438/18; 438/106; 438/613
[58] Field of Search ........................... 438/4, 3, 18, 106, 438/118, 613

[56] References Cited

U.S. PATENT DOCUMENTS

| | | |
|---|---|---|
| 3,615,464 | 10/1971 | Augusta . |
| 4,615,030 | 9/1986 | Kumagai . |
| 4,749,454 | 6/1988 | Arya et al. ................................... 438/4 |
| 5,110,754 | 5/1992 | Lowrey et al. .............................. 438/4 |
| 5,376,573 | 12/1994 | Richart et al. .............................. 438/4 |
| 5,439,840 | 8/1995 | Jones, Jr. et al. ........................ 438/240 |
| 5,512,397 | 4/1996 | Leedy . |
| 5,514,628 | 5/1996 | Enomoto et al. ........................... 438/4 |
| 5,576,223 | 11/1996 | Zeininger et al. ........................ 438/14 |
| 5,616,524 | 4/1997 | Wei et al. ................................... 438/4 |
| 5,620,915 | 4/1997 | Chen et al. ................................. 438/4 |

FOREIGN PATENT DOCUMENTS

| | | |
|---|---|---|
| 4-165639 | 6/1992 | Japan . |
| 6-69345 | 3/1994 | Japan . |

*Primary Examiner*—Kevin M. Picardat
*Assistant Examiner*—Deven Collins
*Attorney, Agent, or Firm*—McDermott, Will & Emery

[57] ABSTRACT

A method of manufacturing a semiconductor memory device includes a first step of forming a plurality of memory cells with a redundancy portion through fine patterning, a second step of searching a defect in masks used in the fine patterning and a third step of forming offset via holes so as to interconnect the redundancy portion instead of a defective portion identified by an inspection in non-fine patterning conducted after the fine patterning.

4 Claims, 8 Drawing Sheets

METHOD OF MANUFACTURING SEMICONDUCTOR MEMORY DEVICE CAPABLE OF READILY REPAIRING DEFECTIVE PORTION RESULTING FROM MASK DEFECT

BACKGROUND OF THE INVENTION

1. Field of the Invention

The present invention relates to a semiconductor memory device, and more particularly, to a method of manufacturing a semiconductor memory device in which a defective memory cell if any is replaced by a normal one.

2. Description of the Background Art

In a mass storage semiconductor device such as a dynamic random access memory (DRAM), a very small portion of a memory circuit fails to work normally due to the dust particles attached to a memory cell during wafer process fabrication.

Then, a common practice to fabricate a chip in which every memory cell operates normally is to preliminarily form spare memory cells as substitute for defective cells.

More specifically, conventionally, every memory circuit has been tested after wafer processing, and based on the results, a fuse circuit on a chip has been disconnected by a laser to replace a defective portion by a redundancy circuit.

FIG. 14 is a circuit diagram showing a conventional redundancy circuit. As shown in FIG. 14, the redundancy circuit includes a node N1 for outputting a signal to activate a redundancy word line and inactivate a normal word line, a plurality of fuses 1 connected to the node N1, and a plurality of N channel MOS transistors NT1 respectively connected between fuse 1 and a ground node.

FIG. 15 is a diagram showing a structure of a conventional 7 bit (128 value) decoder circuit. As shown in FIG. 15, the decoder circuit includes a plurality of AND circuits 3 connected to respective word lines WL and shunt lines, a plurality of decoder lines (first layer aluminum interconnections) 5, which are connected three by three to each AND circuit 3, and a plurality of second layer aluminum interconnections 7 arranged to intersect decoder lines 5. Decoder lines 5 and second layer aluminum interconnections 7 are connected by via holes 9.

In FIGS. 14 and 15, selection signals of XJ, XK and XL groups are those decoded by 2, 2 and 3 bit addresses, respectively. As shown in FIG. 15, each AND circuit 3 is connected to one of the second layer aluminum interconnections 7 from each of XJ, XK and XL groups, respectively, and one of 128 word lines WL is selected. At this time, if one of the 128 word lines WL is connected to a defective memory cell, this single word line can be substituted with a redundancy word line. This substitution is accomplished by disconnecting one of fuses 1 of each of XJ, XK and XL groups. This allows the potential of node N1, which was precharged to a high level by turning on a P channel MOS transistor PT1 before the selection of a specific memory cell by an address, to be retained at a high level even after the selection by the address, so that a high level signal for activating a redundancy word line and inactivating a defective word line can be output from node N1.

Such a redundancy circuit is provided to repair any defective portion accidentally resulting at an unspecific address during chip fabrication, and a photomask, used in fine patterning of memory cells, has been required to be totally free from defects, that is, perfect.

However, the recent scaling down and increasing of capacity for semiconductor memory devices are making manufacture of perfect photomasks more and more difficult. More specifically, a Levenson phase shift mask, which is highly useful for transferring fine patterns in particular, requires a shifter which partially inverts the phase of a light by 180°, in addition to optically transparent and non-transparent portions. The modification of the shifter, however, is very difficult, thereby making manufacture of the perfect photomasks unpromising.

On the other hand, since fabrication of chips with a defective photomask makes the same portion of memory circuits always defective, a conventional method requires that the same portion of every chip should always be substituted with a redundancy circuit, resulting in a problem of decreased productivity due to the time required for the circuit disconnection.

Another problem was that a number of redundancy circuits required to allow a number of defects to be repaired resulted in increased chip area, because of need of the large fuse circuit area.

SUMMARY OF THE INVENTION

It is an object of the present invention to provide a method of manufacturing a semiconductor memory device which is capable of readily repairing a defective portion resulting from a defect, if any, in a mask used in fine patterning process in manufacturing a memory cell.

A method of manufacturing the semiconductor memory device in accordance with one aspect of the present invention includes a first step of forming a plurality of memory cells with a redundancy portion by fine patterning, a second step of searching a defect in masks used in the fine patterning, and if a defect is found in any masks, further includes a third step of interconnecting the redundancy portion instead of the defective portion resulting from the defect in non-fine patterning process which is carried out after the fine patterning process.

A method of manufacturing a semiconductor memory device in accordance with another aspect of the invention includes a first step of manufacturing sample semiconductor memory devices for process evaluation with a redundancy portion by using a plurality of masks, a second step of inspecting if there is any defect common to the samples, and a third step of modifying the layout of the masks used in the non-fine patterning process to interconnect the redundancy portion instead of the defective portion found in the second step by using the modified mask for device mass production.

Accordingly, a primary advantage of the present invention is that any defect resulting from fine patterning process can easily be repaired in non-fine patterning process.

Another advantage of the present invention is that the defect can easily be repaired by modifying the mask used in non-fine patterning process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in detail with reference to the accompanying drawings. It is noted that the same or a corresponding portion is denoted by the same reference in the figures.

First Embodiment

In the following, the process of fabricating two memory cells and a decoder portion will be described as an example with reference to the drawings.

Figure 2:
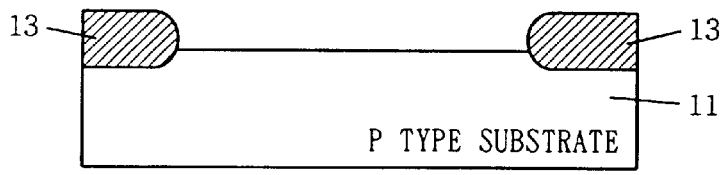
FIG. 2 is a diagram showing a LOCOS field isolation process.

First, LOCOS field isolation is carried out. As shown in FIG. 2, LOCOS field isolation is accomplished by coating with silicon nitride, etching on a P-type silicon substrate 11 and oxidizing to form $SiO_2$ LOCOS 13 and removing the nitride film.

Figure 3:
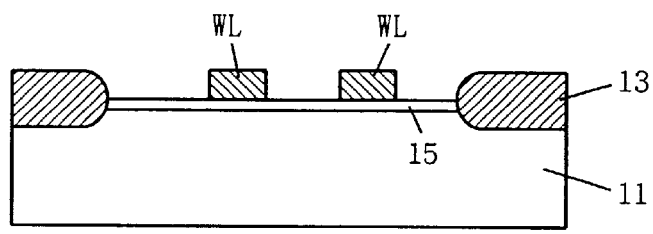
FIG. 3 is a diagram showing a word line forming process.

Then, as shown in FIG. 3, an oxide film 15, having the thickness of approximately 100 Å, is formed, polysilicon is provided thereon, and word lines WL are formed by transferring a mask pattern and etching.

Figure 4:
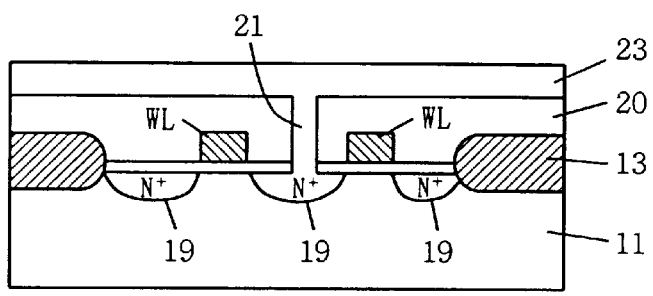
FIG. 4 is a diagram showing a bit line forming process.

Next, as shown in FIG. 4, $N^+$ layers 19 are formed by ion implantation and an $SiO_2$ layer 20 is provided over word lines WL. Then, a hole 21 is opened in $SiO_2$ layer 20 by bit line contact transferring and etching, and polysilicon layer 23 is provided over the $SiO_2$ layer 20 to form a bit line (polysilicon layer 23) crossing word lines WL.

Figure 5:
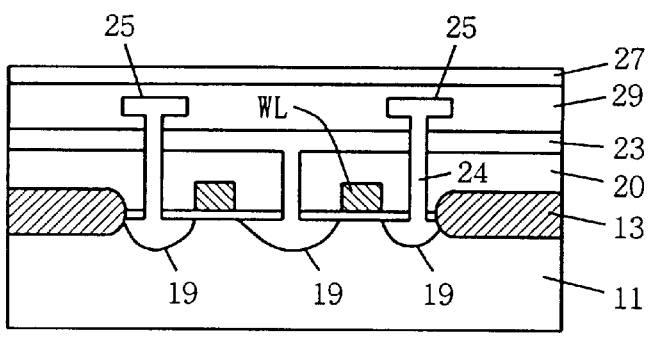
FIG. 5 is a diagram showing a capacitor forming process.

Next, as shown in FIG. 5, holes 24 are opened in $SiO_2$ layer 20 by storage node contact transferring and etching. Then polysilicon is provided thereon, and storage node is processed. A $SiO_2$ layer 29 is further applied thereon, and a cell plate 27 made of silicon is further provided thereon. Thus capacitors 25 are completed.

Figure 6:
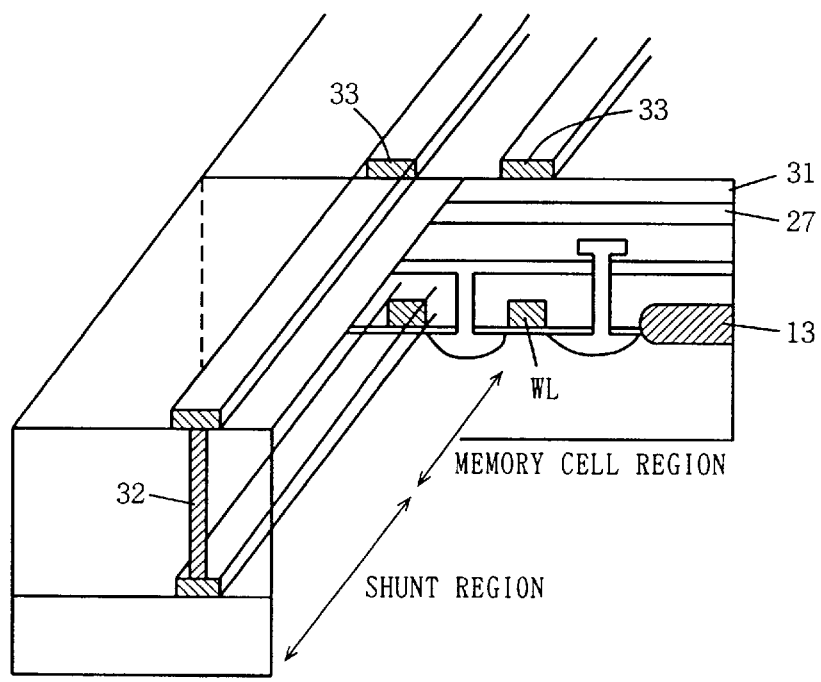
FIG. 6 is a diagram showing a shunt line forming process.

Next, as shown in FIG. 6, a $SiO_2$ layer 31 is provided over the cell plate 27 and a contact hole 32 is opened through $SiO_2$ layer 31 in the shunt region provided between the memory cells arranged in an array. Shunt lines 33, consisting of a first layer of aluminum are then formed both on $SiO_2$ layer 31 and on word lines WL. The shunt lines 33 are the same nodes as the word lines WL in terms of a circuit function. However, they have a function of reducing parasitic resistance from a decoder to a memory cell and access time by using low resistance aluminum and the like for shunting word lines WL which is relatively high in resistivity because of being made of a material such as polysilicon.

Figure 7:
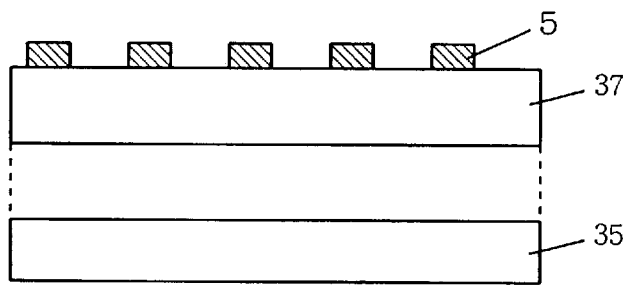
FIG. 7 is a diagram showing a decoder line (first layer aluminum interconnection) forming process.
Figure 15:
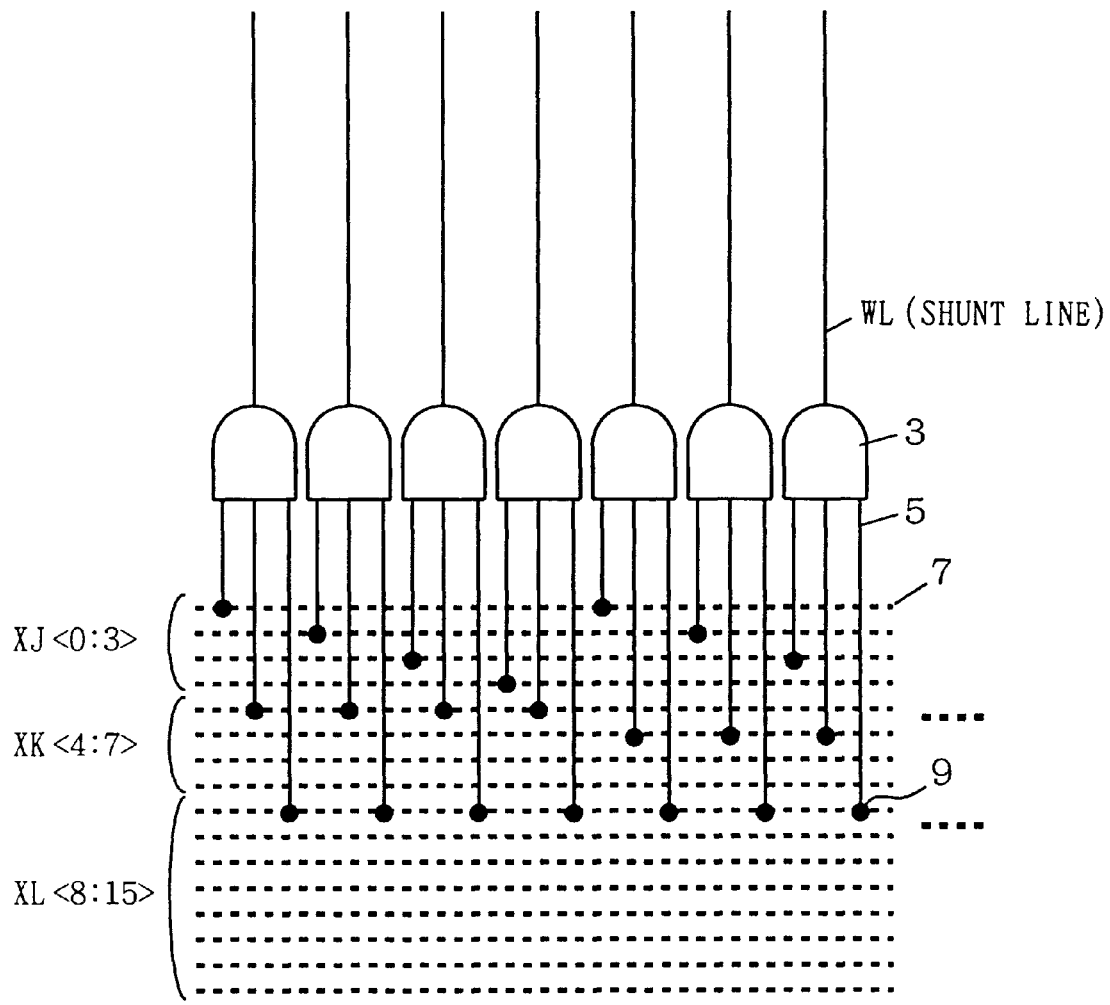
FIG. 15 is a diagram showing a structure of a conventional 7 bit decoder circuit.

Here, decoder lines 5 shown in FIG. 15 are formed together with shunt lines 33. FIG. 7 is a cross section showing decoder lines 5. As shown in FIG. 7, decoder lines 5 are formed on the $SiO_2$ layer 37 provided over a silicon substrate 35 as first layer aluminum similar to shunt line 33.

In the above described processes of manufacturing a semiconductor memory device, the steps up to formation of capacitor 25 are those which requires fine patterning (the steps are referred to as fine patterning process in totality).

Next, at this stage of fabrication, inspection is conducted for the chip (or wafer) which has gone through the above described processes.

In the above described processes of fabricating the memory cells, a different mask is used for each process, so that a defective portion, if any, in memory cells or the like is detected by searching a defect of every mask successively.

Figure 10:
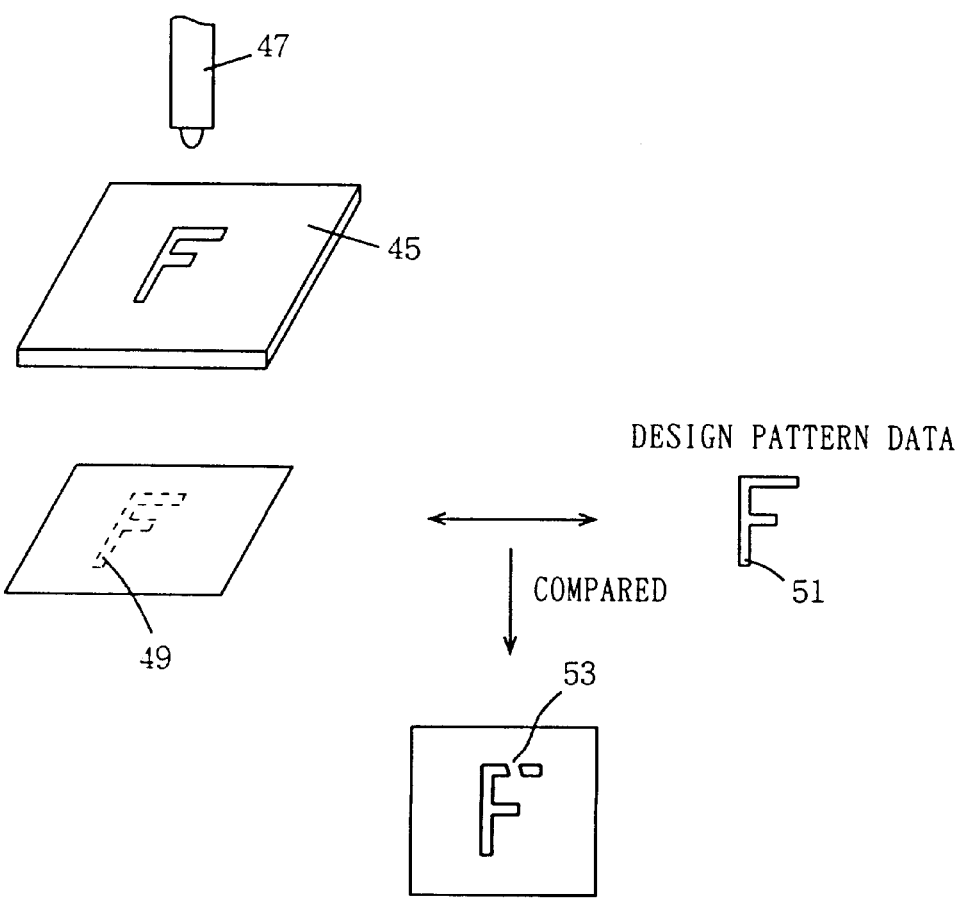
FIG. 10 is a diagram showing an example of a method of mask inspection.

FIG. 10 shows a method of inspecting a mask. Here, as an example, a case in which a shape "F" is transferred onto a semiconductor substrate, is illustrated.

As shown in FIG. 10, a mask 45 is illuminated by a light source 47 and the image 49 thereof is picked up by a CCD (Change Coupled Device) camera or the like. Then, resulting image 49 of mask 45 is compared with a design pattern data 51, and a portion 53 which is incomplete is defined as defective.

Figure 11:
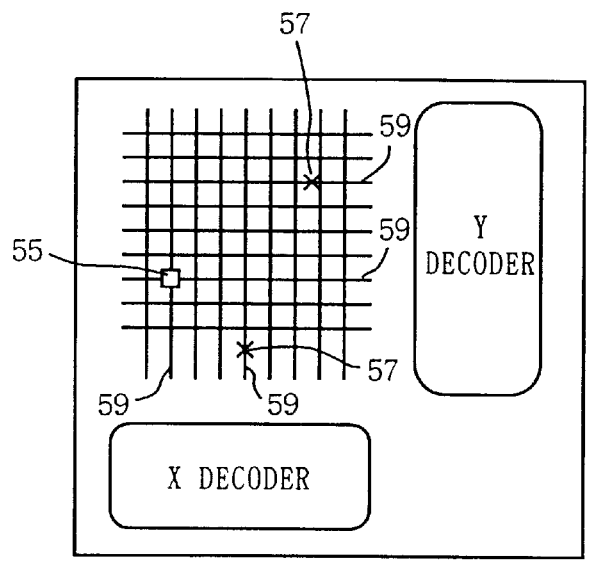
FIG. 11 is an illustration of a method of identifying a defective portion by inspection.

As shown in FIG. 11, if defective portion 55 derived from a defect of the mask used in the element isolation process is detected and a disconnection portion 57 derived from a defect of the mask used in the process of forming word lines or bit lines is detected through the inspection, defective lines 59 are disconnected and substituted with redundancy lines.

It is noted that, as another inspection method for detecting defective portions, the patterns produced during wafer processing for structuring the memory cells can be inspected step by step directly to extract a word line or a bit line connected to the defective cell.

Figure 1:
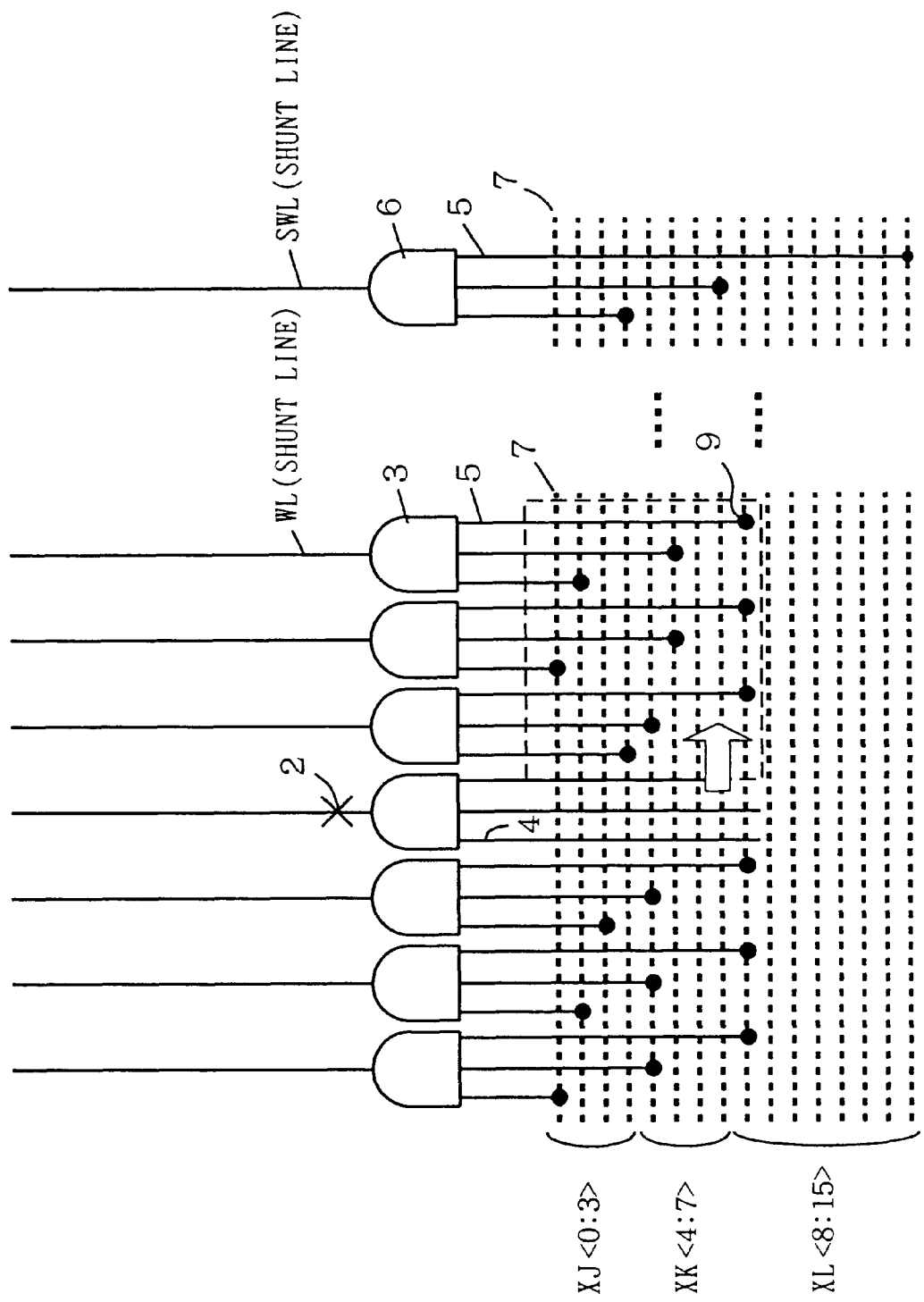
FIG. 1 is a diagram showing a method of manufacturing a semiconductor memory device in accordance with a first embodiment of the present invention.

FIG. 1 shows a structure in which word line WL having a defect 2 is substituted with a redundancy word line SWL. As shown in FIG. 1, after the first layer aluminum interconnection as a decoder line 5 is provided in accordance with the above mentioned process, a via hole is not formed in decoder line 4 corresponding to word line WL with defect 2 but formed offset therefrom. This allows word line WL with the defect 2 to be substituted with redundancy word line SWL without being connected to second layer aluminum interconnection 7.

Figure 8:
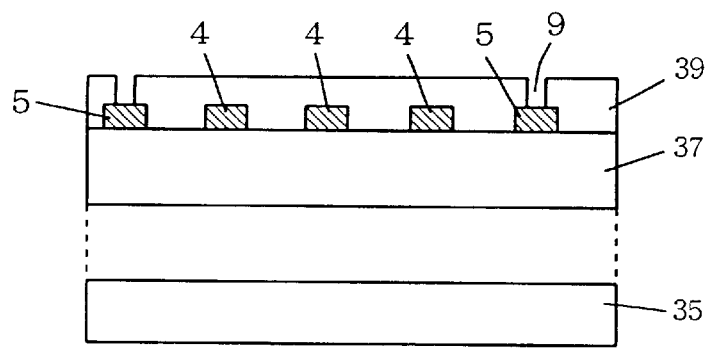
FIG. 8 is a diagram showing a via hole forming process.

FIG. 8 is a cross section showing a structure with an insulation layer 39 provided over decoder lines (first layer aluminum interconnection) 5 and via holes 9 formed in the insulation layer 39. As shown in FIG. 8, via holes 9 are not formed in decoder lines 4 connected to a defective portion.

Figure 9:
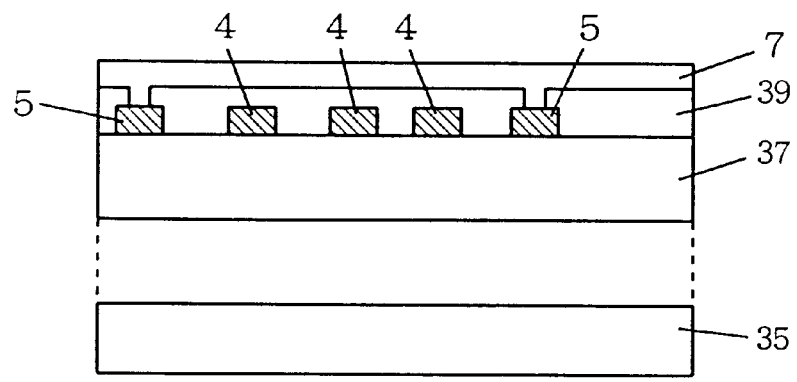
FIG. 9 is a diagram showing a second layer aluminum interconnection forming process.

FIG. 9 is a diagram showing a structure with second layer aluminum interconnection 7 formed on insulation layer 39, orthogonally crossing decoder lines 4 and 5.

Figure 12:
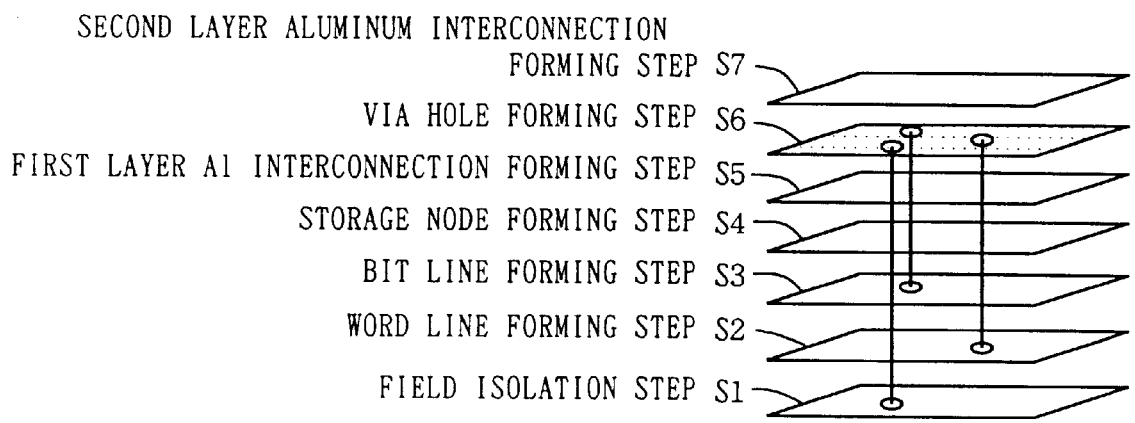
FIG. 12 is a schematic diagram showing the processes of manufacturing a semiconductor memory device.

FIG. 12 is a schematic diagram showing the manufacturing process described above. The process from the step S1 of field isolation through the step S4 of forming storage node shown in FIG. 12, requires fine patterning for the memory cell formation. If there is a defect in the masks used in fine patterning process, the present embodiment repairs it in the subsequent via hole forming process S6 which is included in non-fine patterning process, so that the provision of extra fuse circuits used for repairing accidental defects and the switching of the fuses according to the result of testing as in a conventional method would be unnecessary. Thus, the present embodiment is effective for reducing chip area occupied by a fuse circuit portion as well as the time required for testing.

Second Embodiment

A method of manufacturing a semiconductor memory device in accordance with the present embodiment is similar to that in accordance with the first embodiment except for the manufacturing method after the formation of the decoder lines (first layer aluminum interconnection) 4 and 5.

Figure 13:
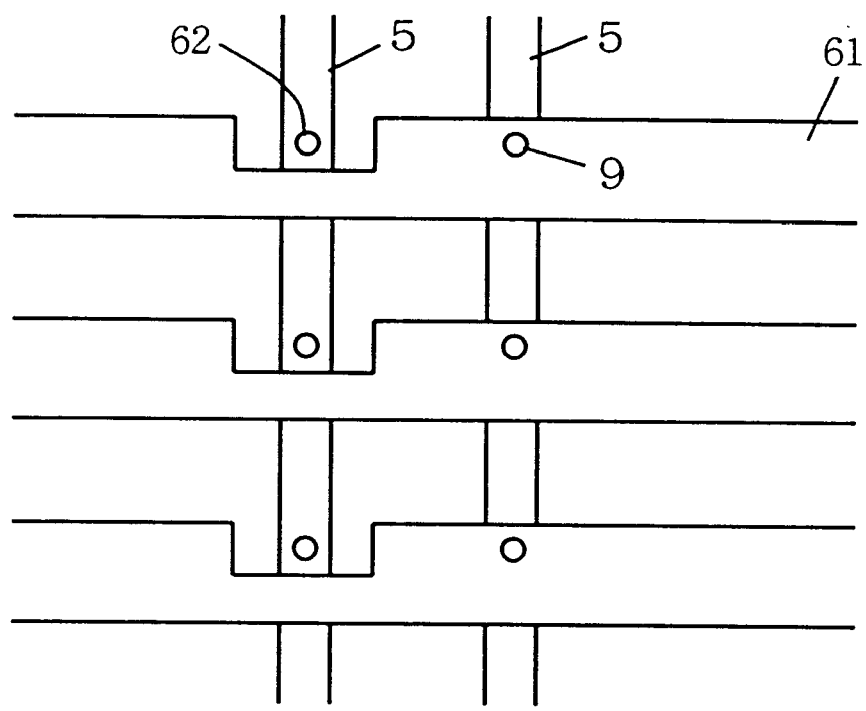
FIG. 13 is a diagram showing a method of manufacturing a semiconductor memory device in accordance with a second embodiment of the present invention.
Figure 14:
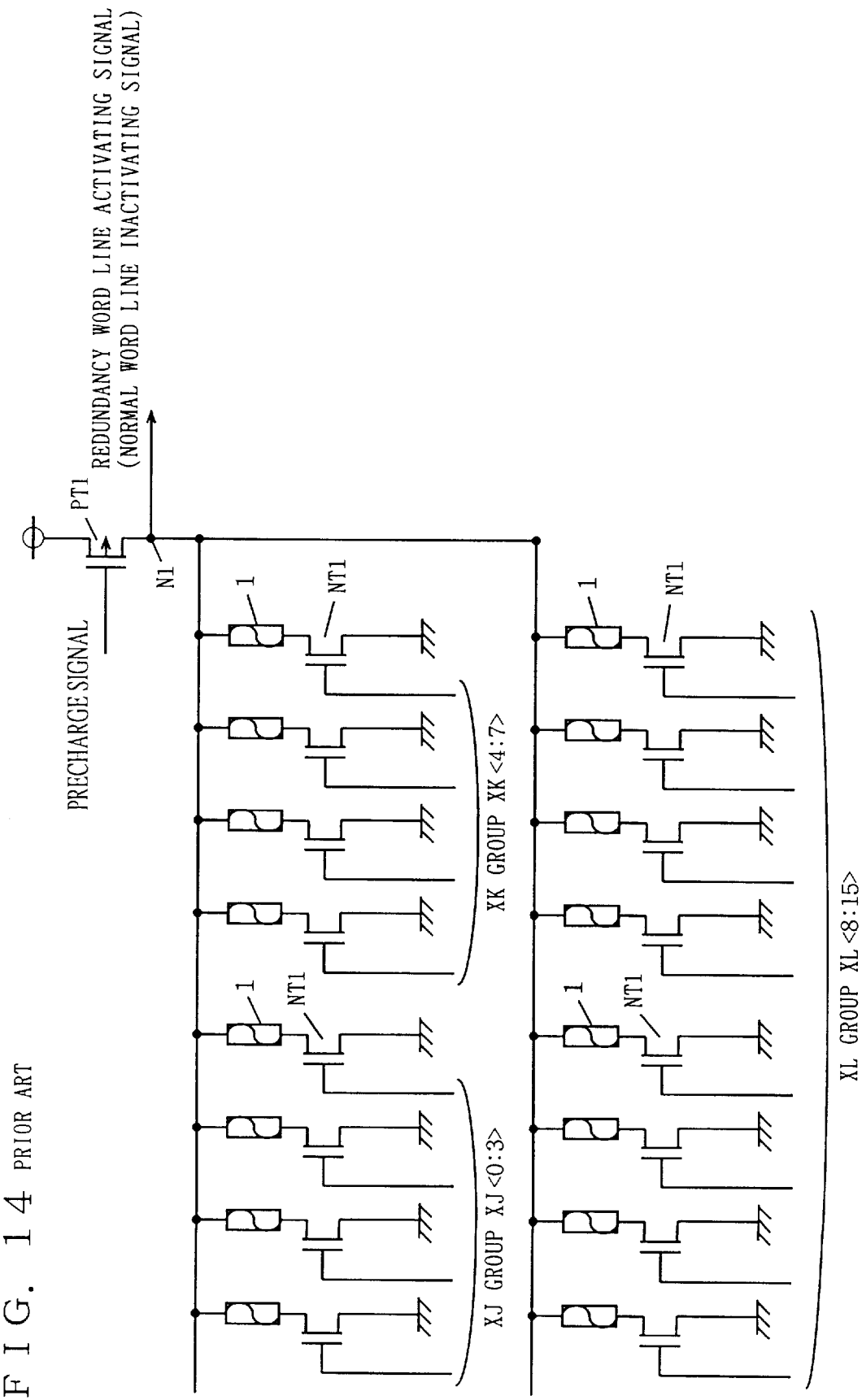
FIG. 14 is a circuit diagram showing a conventional redundancy circuit.

In other words, if a defective portion is found by the above mentioned inspection of the mask defect, decoder line 4 corresponding to the defective portion and second layer aluminum interconnection 7 should not be interconnected. Accordingly, second layer aluminum interconnections 61 are formed avoiding via holes 62 formed in the non-connected decoder line (first layer aluminum interconnection) 4, as shown in FIG. 13.

By this method also, the defective portion derived from the defect in the masks used in fine patterning process for memory cell formation can be repaired, as it is substituted with a redundancy circuit through the above second layer aluminum interconnection formation process in non-fine patterning process.

Third Embodiment

In the methods of manufacturing semiconductor memory devices in accordance with the above described first and second embodiments, first layer aluminum interconnection is completed before chip inspection and the layout of the mask used in non-fine patterning process for repairing a defect is determined depending on the inspection result. However, there are other possible methods of repairing defects.

That is, every process of the manufacture is completed by using a mask without substituting with a redundancy circuit to complete samples. Then, a common defect on the samples is extracted by testing them with a tester. Subsequently, the layout of the mask used in non-fine patterning process after capacitor forming process is modified so as not to interconnect the defective portion causing the common defect extracted in this way (for example, forming offset via holes as described in the first embodiment above or modifying the layout of second layer aluminum interconnections as described in the second embodiment above), and products are manufactured using the mask with the modified layout.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor memory device, comprising:

the first step of forming a plurality of memory cells with a redundancy portion through fine patterning;

the second step of searching for a defect in a mask used in said fine patterning; and the third step of interconnecting said redundancy portion instead of a defective portion resulting from said defect in said mask, in non-fine patterning conducted after said fine patterning, if any defect is found in said mask at said second step.

2. The method of manufacturing a semiconductor memory device in accordance with claim 1, wherein said first step includes the steps of isolating a field on a semiconductor substrate, forming a plurality of word lines on said semiconductor substrate, forming a plurality of bit lines crossing said word lines, and forming a plurality of capacitors included in said memory cells; and said third step includes the steps of forming a shunt line on each of said word lines and forming a plurality of decoder lines for a decoder circuit connected to each of said word lines, respectively using a first conductive line, forming an insulation layer on said decoder lines, forming a via hole at a prescribed position in said insulation layer avoiding said decoder lines of said decoder circuit which is connected to one of said word lines with the defect found in said second step, and forming a second conductive line on said insulation layer.

3. A method of manufacturing a semiconductor memory device, comprising:

the first step of manufacturing samples of a semiconductor memory device with a redundancy portion by using a mask;

the second step of searching for a defect common to said samples; and the third step of modifying a layout of said mask used in non-fine patterning process to connect said redundancy portion instead of a defective portion resulting from said defect found in said second step, and manufacturing a product using said modified mask.

4. The method of manufacturing a semiconductor memory device in accordance with claim 3, wherein said first step includes the steps of isolating a field on a semiconductor substrate, forming a plurality of word lines on said semiconductor substrate;

forming a plurality of bit lines crossing said word lines, forming a plurality of capacitors included in said memory cells, forming a shunt line on each of said word lines and forming a plurality of decoder lines for a decoder circuit connected to each of said word lines, respectively using a first conductive line, forming an insulation layer on said decoder lines, forming a via hole at a prescribed position in said insulation layer, and forming a second conductive line on said insulation layer; and said third step includes the steps of isolating a field on a semiconductor substrate, forming a plurality of word lines on said semiconductor substrate, forming a plurality of bit lines crossing said word lines, forming a plurality of capacitors included in said memory cells, forming a shunt line on each of said word lines and forming a plurality of decoder lines for a decoder circuit connected to each of said word lines, respectively using a first conductive line, forming an insulation layer on said decoder lines, forming a via hole at a prescribed position in said insulation layer avoiding said decoder lines of said decoder circuit which is connected to one of said word lines with the defect found in said second step, and forming a second conductive line on said insulation layer.

* * * * *